US009576842B2

(12) United States Patent
Griffin

(10) Patent No.: US 9,576,842 B2
(45) Date of Patent: Feb. 21, 2017

(54) GRASS REMOVAL IN PATTERNED CAVITY ETCHING

(71) Applicant: Icemos Technology Ltd., Belfast (GB)

(72) Inventor: Hugh J. Griffin, Newtownabbey (GB)

(73) Assignee: Icemos Technology, Ltd., Belfast (GB)

( * ) Notice: Subject to any disclaimer, the term of this patent is extended or adjusted under 35 U.S.C. 154(b) by 188 days.

(21) Appl. No.: 14/102,023

(22) Filed: Dec. 10, 2013

(65) Prior Publication Data
US 2016/0225638 A1 Aug. 4, 2016

Related U.S. Application Data

(60) Provisional application No. 61/735,098, filed on Dec. 10, 2012.

(51) Int. Cl.
*H01L 21/762* (2006.01)
*H01L 21/308* (2006.01)

(52) U.S. Cl.
CPC ..... *H01L 21/76251* (2013.01); *H01L 21/3083* (2013.01)

(58) Field of Classification Search
CPC ............. H01L 21/30655; H01L 21/308; H01L 21/76251
See application file for complete search history.

(56) References Cited

U.S. PATENT DOCUMENTS

| 4,211,582 | A | 7/1980 | Horng et al. |
| 4,238,278 | A | 12/1980 | Antipov |
| 4,491,486 | A | 1/1985 | Iwai |
| 4,866,004 | A | 9/1989 | Fukushima |
| 4,895,810 | A | 1/1990 | Meyer et al. |
| 4,994,406 | A | 2/1991 | Vasquez et al. |
| 5,019,522 | A | 5/1991 | Meyer et al. |
| 5,366,914 | A | 11/1994 | Takahashi et al. |
| 5,432,113 | A | 7/1995 | Tani |
| 5,479,048 | A | 12/1995 | Yallup et al. |
| 5,585,285 | A | 12/1996 | Tang |
| 5,902,127 | A | 5/1999 | Park |
| 5,926,713 | A | 7/1999 | Hause et al. |
| 6,174,773 | B1 | 1/2001 | Fujishima |

(Continued)

FOREIGN PATENT DOCUMENTS

| WO | 2005001941 A2 | 1/2005 |
| WO | 2005031880 A1 | 4/2005 |

*Primary Examiner* — Charles Garber
*Assistant Examiner* — Brigitte Paterson
(74) *Attorney, Agent, or Firm* — Panitch Schwarze Belisario & Nadel LLP

(57) ABSTRACT

A method of manufacturing a semiconductor device includes providing a first semiconductor substrate having a first main surface and an opposing second main surface, and forming a pattern into the first semiconductor substrate. The pattern includes a plurality of trenches defining a plurality of mesas. Each of the plurality of mesas has sidewalls and a free surface formed by material of the first semiconductor substrate. The method further includes forming a cavity in the first semiconductor substrate such that the pattern is recessed in the cavity, forming an oxide layer in the cavity and on the sidewalls and free surfaces of the plurality of mesas, and etching the oxide layer to remove the oxide layer from the free surfaces of the plurality of mesas and at least a portion of the sidewalls of the plurality of mesas.

17 Claims, 7 Drawing Sheets

(56) References Cited

U.S. PATENT DOCUMENTS

| | | |
|---|---|---|
| 6,214,698 B1 | 4/2001 | Liaw et al. |
| 6,495,421 B2 | 12/2002 | Luo |
| 6,534,367 B2 | 3/2003 | Peake et al. |
| 6,613,644 B2 | 9/2003 | Lachner |
| 6,762,473 B1 | 7/2004 | Goushcha et al. |
| 6,797,589 B2 | 9/2004 | Adams et al. |
| 6,940,144 B2 | 9/2005 | Nakayama |
| 6,947,275 B1* | 9/2005 | Anderson ............... H01G 4/012 257/301 |
| 7,015,104 B1 | 3/2006 | Blanchard |
| 7,023,069 B2 | 4/2006 | Blanchard |
| 7,041,560 B2 | 5/2006 | Hshieh |
| 7,052,982 B2 | 5/2006 | Hshieh et al. |
| 2004/0157410 A1 | 8/2004 | Yamaguchi |
| 2005/0176192 A1 | 8/2005 | Hshieh |
| 2006/0079024 A1 | 4/2006 | Akram |
| 2006/0231877 A1* | 10/2006 | Takenaka ............ H01L 27/0207 257/296 |
| 2007/0166997 A1 | 7/2007 | Knorr |
| 2007/0262378 A1 | 11/2007 | Wilson et al. |

\* cited by examiner

GRASS REMOVAL IN PATTERNED CAVITY ETCHING

CROSS-REFERENCE TO RELATED APPLICATIONS

This application claims priority to U.S. Provisional Patent Application No. 61/735,098, filed on Dec. 10, 2012, entitled "Grass Removal in Patterned Cavity Etching," the entire contents of which are incorporated by reference herein.

BACKGROUND OF THE INVENTION

Embodiments of the present invention relate generally to a method of manufacturing semiconductor devices, and more particularly, to a method of manufacturing semiconductor devices to remove an unwanted defect in patterned cavities known as "grass."

During deep reactive ion etching (DRIE) processing, a defect known as "grass" is known to occur. "Grass" refers to thin spikes of silicon or other semiconductor material remaining after the etch process. An example of this defect is shown in FIG. 13. In most cases, the chemistry of the etching process can be adjusted to remove the occurrence of "grass." However, in some circumstances, the etch chemistry cannot be adjusted to eliminate this defect.

For example, in applications requiring a double etch, i.e., a pattern formation in a semiconductor layer followed by formation of cavity such that the pattern becomes recessed in the cavity, the process itself appears to cause heavy grass formation. Accordingly, it is desired to provide a process solution to remove unwanted "grass" defects during double etch procedures.

BRIEF SUMMARY OF THE INVENTION

Briefly stated, an embodiment of the present invention comprises a method of manufacturing a semiconductor device. The method includes providing a first semiconductor substrate having a first main surface and an opposing second main surface, and forming a pattern into the first semiconductor substrate. The pattern includes a plurality of trenches defining a plurality of mesas. Each of the plurality of mesas has sidewalls and a free surface formed by material of the first semiconductor substrate. The method further includes forming a cavity in the first semiconductor substrate such that the pattern is recessed in the cavity, forming an oxide layer in the cavity and on the sidewalls and free surfaces of the plurality of mesas, and etching the oxide layer to remove the oxide layer from the free surfaces of the plurality of mesas and at least a portion of the sidewalls of the plurality of mesas.

BRIEF DESCRIPTION OF THE DRAWINGS

The foregoing summary, as well as the following detailed description of preferred embodiments of the invention, will be better understood when read in conjunction with the appended drawings. For the purpose of illustration, there are shown in the drawings embodiments which are presently preferred. It should be understood, however, that the invention is not limited to the precise arrangements and instrumentalities shown.

DETAILED DESCRIPTION OF THE INVENTION

Figure 1:
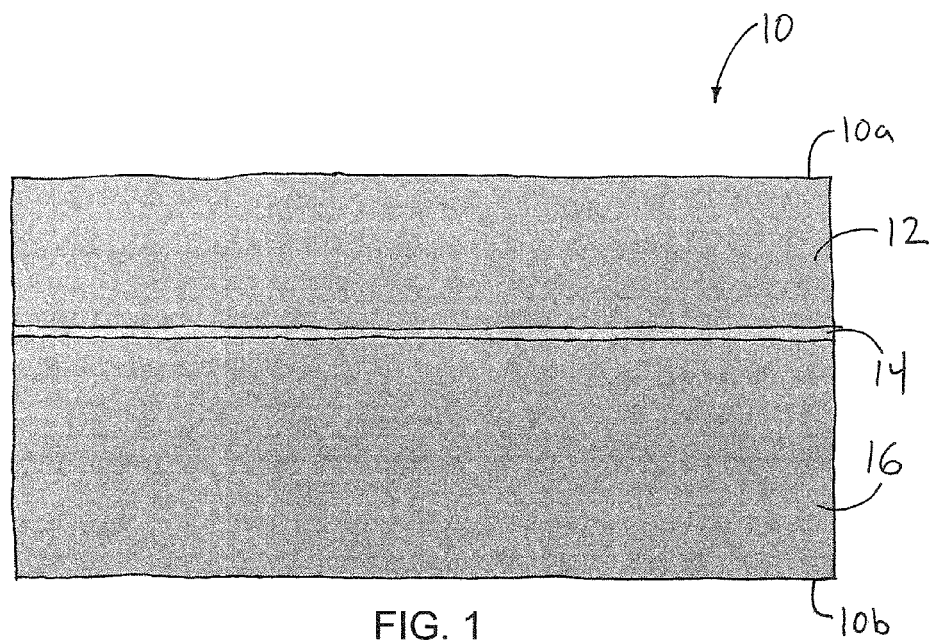
FIG. 1 is an enlarged partial cross-sectional elevational view of a first semiconductor substrate in accordance with a preferred embodiment of the present invention.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the semiconductor device and designated parts thereof. The terminology includes the above-listed words, derivatives thereof, and words of similar import. Additionally, the words "a" and "an", as used in the claims and in the corresponding portions of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Referring to the drawings in detail, wherein like reference numerals indicate like elements throughout, there is shown in FIG. 1 a first semiconductor substrate 10 having opposing first and second main surfaces 10a, 10b, and which preferably has a semiconductor-on-insulator (SOI) structure. That is, the substrate 10 includes a first semiconductor layer or "device layer" 12, a dielectric layer 14, and a second semiconductor layer or "handle layer" 16. The device features for the end product are typically formed in the device layer 12. The device layer 12 preferably has a thickness in a range of about 2 to about 250 micrometers (μm). In one preferred embodiment, the device layer has a thickness of about 32 μm. The dielectric layer 14 preferably has a thickness of about 0.1 to about 5 μm. The handle layer 16 preferably has a thickness in a range of 100-1000 μm. However, other dimensions may be utilized as appropriate.

Preferably, the handle layer 16 is formed of silicon (Si). But, the handle layer 16 may be formed of other materials such as gallium arsenide (GaAs), germanium (Ge), or the like. The handle layer 16 is preferably oxidized to form the dielectric layer 14. The dielectric layer 14 is applied using one of thermal growth, low pressure (LP) chemical vapor deposition (CVD), plasma enhanced chemical vapor deposition (PECVD), atmospheric pressure chemical vapor deposition (APCVD) and deposition. The dielectric layer 14 is preferably formed of an oxide. Alternatively, the dielectric layer 14 may be a nitride, silicon-oxynitride or other known dielectrics. The dielectric layer 14 on the handle layer 16 may be formed by any known technique.

The device layer 12 can be formed by bonding or otherwise forming a semiconductor layer on the dielectric layer 14. Preferably, the device layer 12 is silicon. But, the device layer 12 may be formed of other materials such as gallium arsenide, germanium or the like. For example, the device layer 12 is typically a doped p-type or n-type silicon layer.

Figure 2:
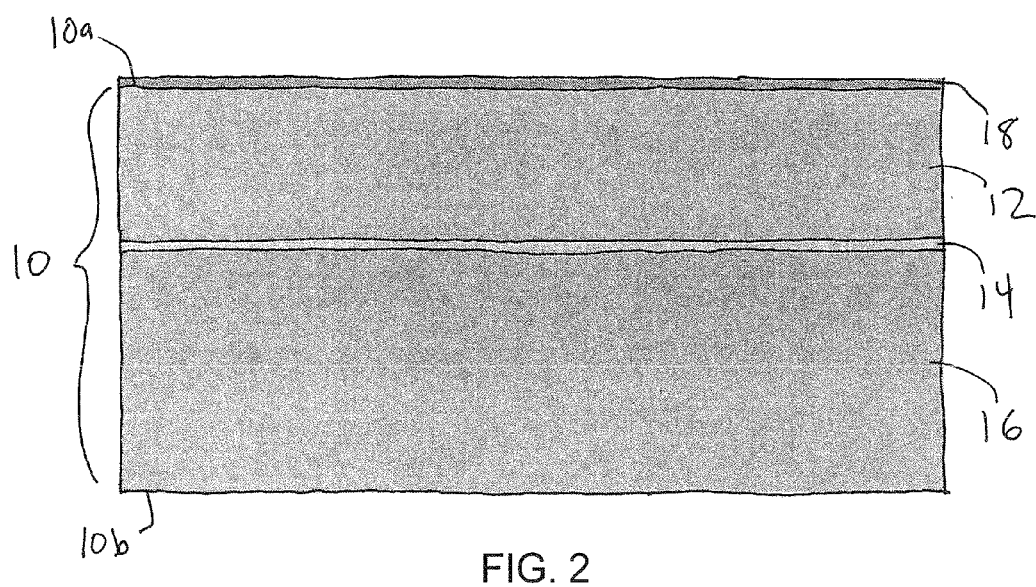
FIG. 2 is an enlarged partial cross-sectional elevational view of the substrate of FIG. 1 with a thermal oxide mask layer applied thereon.

In FIG. 2, a thermal oxide mask layer 18 is formed on the first main surface 10a of the first semiconductor substrate 10. The thermal oxide mask layer 18 is preferably applied using thermal growth performed at temperatures between about 800° and about 1200° C.

Figure 3:
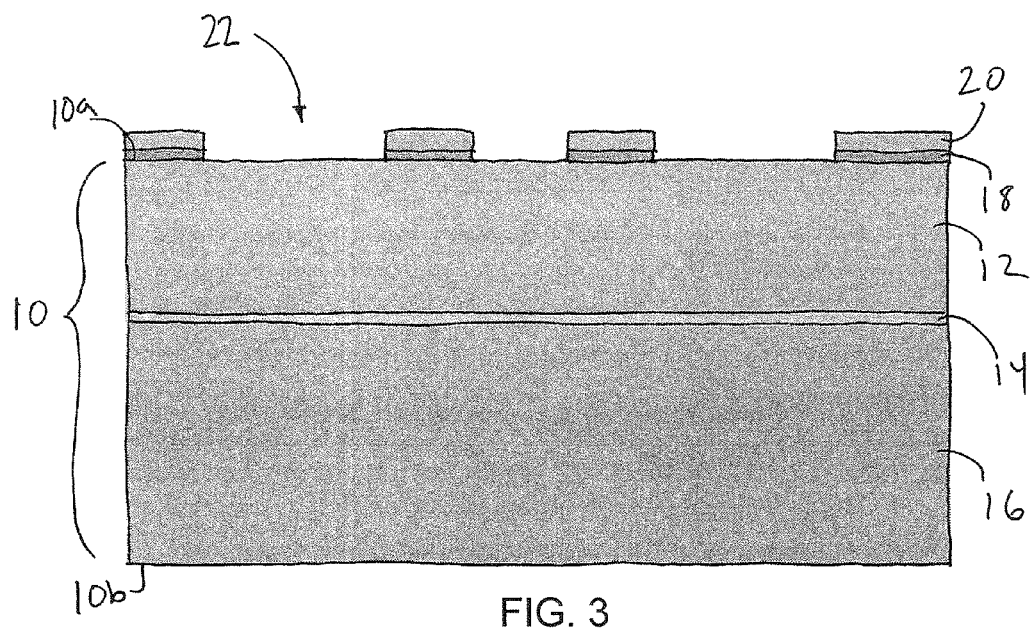
FIG. 3 is an enlarged partial cross-sectional elevational view of the substrate of FIG. 2 with a first layer of photoresist applied thereon and the thermal oxide mask layer having been etched.
Figure 4:
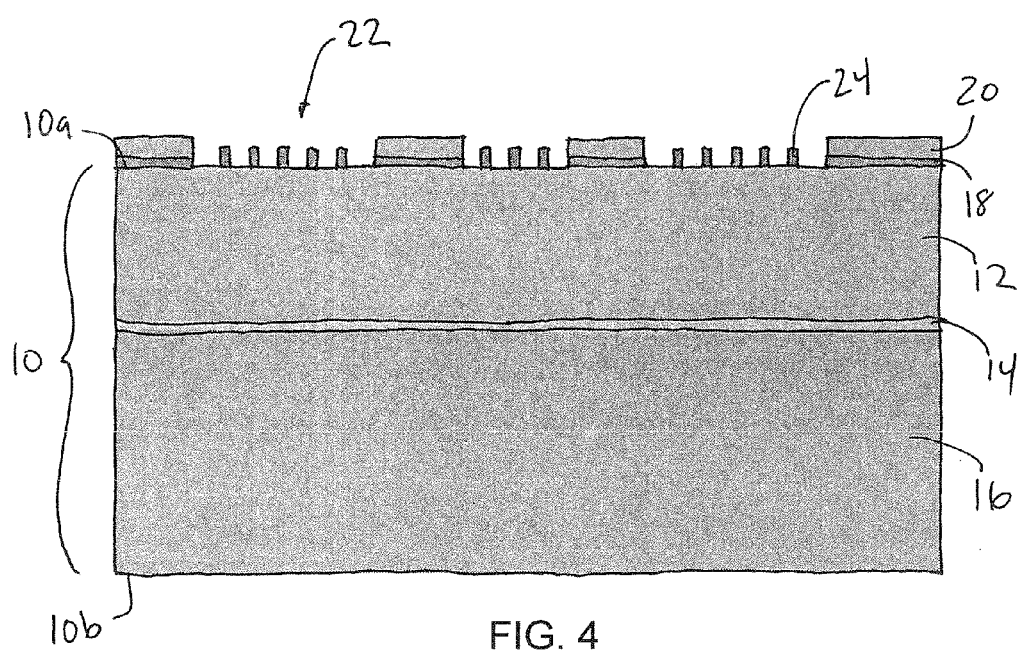
FIG. 4 is an enlarged partial cross-sectional elevational view of the substrate of FIG. 3 with a second layer of photoresist applied thereon.

In FIG. 3, a first photoresist layer 20 is applied to the thermal oxide mask layer 18. The first photoresist layer 20 is patterned to remove portions of the thermal oxide mask layer 18 to form openings 22. The openings 22 define locations of cavities that are formed later in the process in the first main surface 10a of the first semiconductor substrate 10. Portions of the first photoresist layer 20 and portions of the thermal oxide mask layer 18 corresponding to the openings may be removed in a single etching step or the etching may be performed in stages. In FIG. 4, a second photoresist layer 24 is applied to the first main surface 10a of the first semiconductor substrate 10 within the openings 22 of the thermal oxide mask layer 18. The second photoresist layer 24 defines a pattern as described below in the first semiconductor substrate 10.

Figure 5:
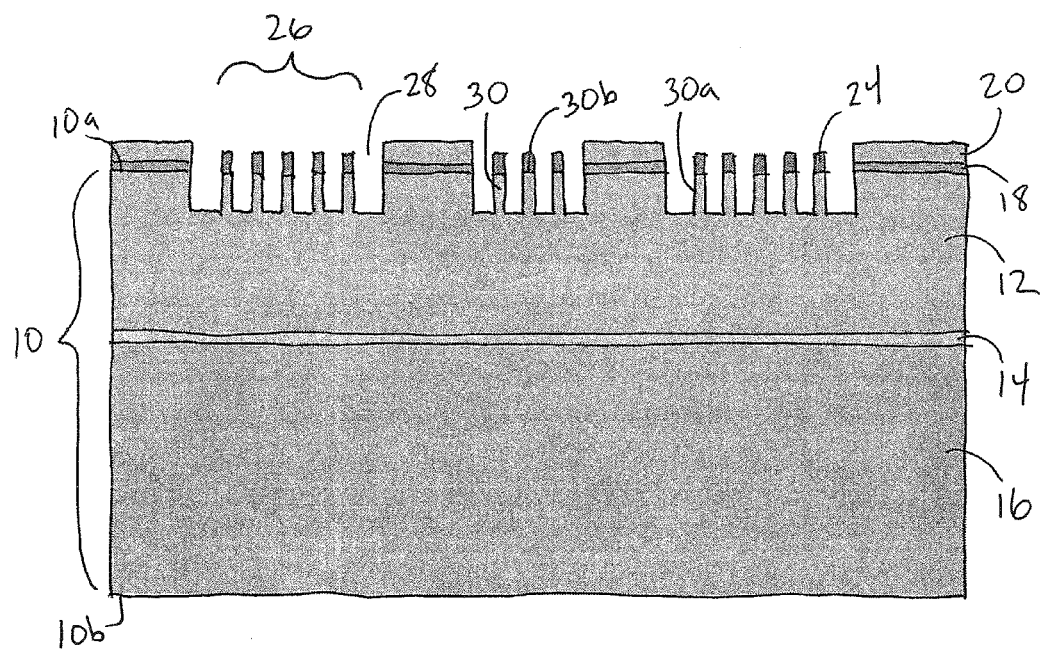
FIG. 5 is an enlarged partial cross-sectional elevational view of the substrate of FIG. 4 with a pattern formed therein.
Figure 12:
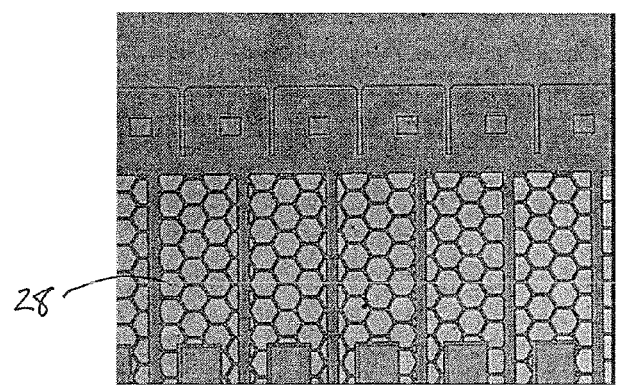
FIG. 12 is an enlarged partial top plan view of a device with a honeycomb hexagonal pattern in accordance with a preferred embodiment of the present invention.
Figure 13:
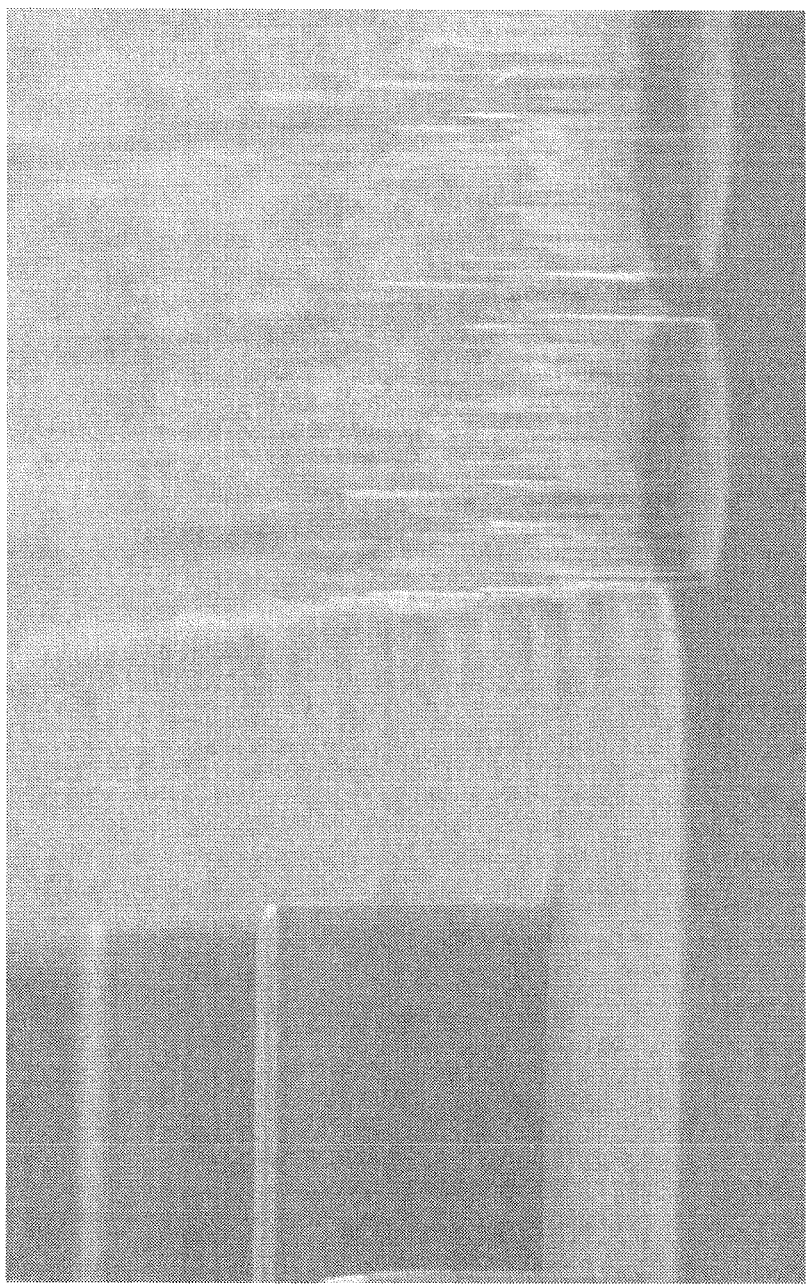
FIG. 13 is an enlarged perspective view of a device exhibiting a defect known as "grass."

In FIG. 5, the first semiconductor substrate 10 is etched to form a pattern 26 therein. The pattern 26 includes a plurality of trenches 28 that define a plurality of mesas 30. Each mesa has sidewalls 30a and a free (top) surface 30b formed by material of the first semiconductor substrate 10. In a preferred embodiment, the pattern 26 is in the form of a honeycomb, and the trenches 28 each have a hexagonal cross-section, as shown in FIG. 12. However, other cross-section shapes may be used.

The trenches 28 are preferably formed by deep reactive ion etching (DRIE). DRIE utilizes an ionized gas, or plasma, to remove material from the first semiconductor substrate 10, such as, for example, sulfur hexafluoride ($SF_6$). Alternatively, the trenches 28 may be formed utilizing other techniques known in the art such as plasma etching, RIE, sputter etching, vapor phase etching, chemical etching, or the like. In preferred embodiments, the sidewalls 30a of the mesas 30 extend in a range from about 2 through about 10 μm, and more preferably from about 4 to about 8 μm.

Figure 6:
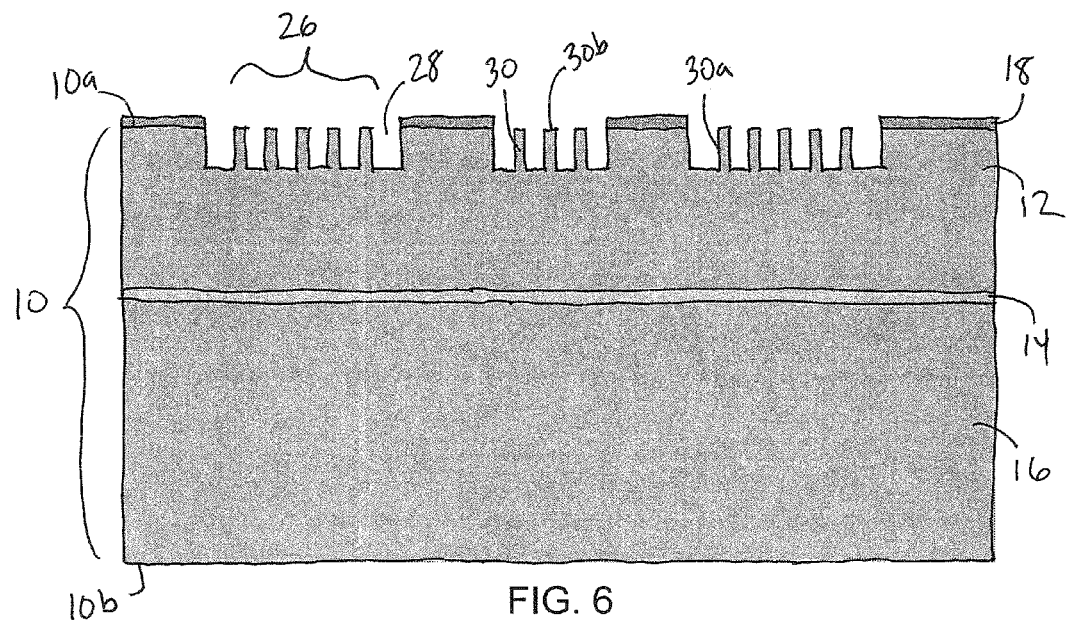
FIG. 6 is an enlarged partial cross-sectional elevational view of the substrate of FIG. 5 with the first and second layers of photoresist removed.
Figure 7:
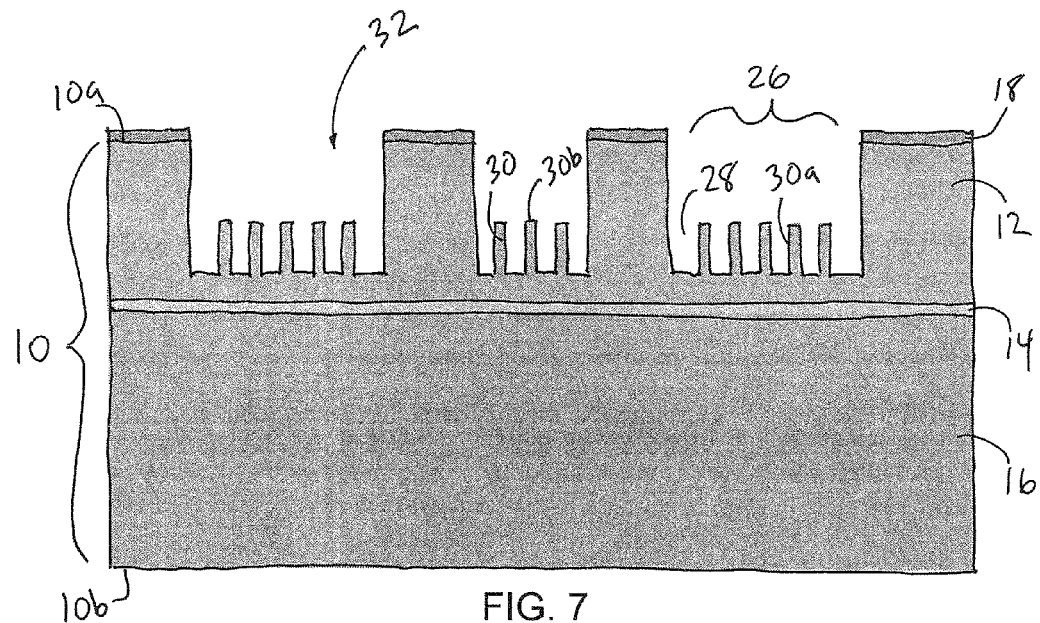
FIG. 7 is an enlarged partial cross-sectional elevational view of the substrate of FIG. 6 with cavities formed therein.

In FIG. 6, the remaining portions of the first and second photoresist layers 20, 24 are stripped using techniques known in the art. In FIG. 7, the first semiconductor substrate 10 is etched a second time to form cavities 32, using the openings 22 in the thermal oxide mask layer 18. Like the pattern 26, the cavities 32 are preferably etched using DRIE, although other techniques may be used. The cavities 32 are preferably etched to a depth between about 15 to about 25 μm, and more preferably to a depth between about 20 and about 22 μm. As a result of the formation of the cavities 32, the previously etched pattern 26 is recessed in the cavities 32. That is, where the pattern 26 had previously been formed at the first main surface 10a of the first semiconductor substrate 10, the pattern 26 is entirely shifted downward to the bottom of the cavities 32. Following formation of the cavities 32, the thermal oxide mask layer 18 is preferably removed.

Figure 8:
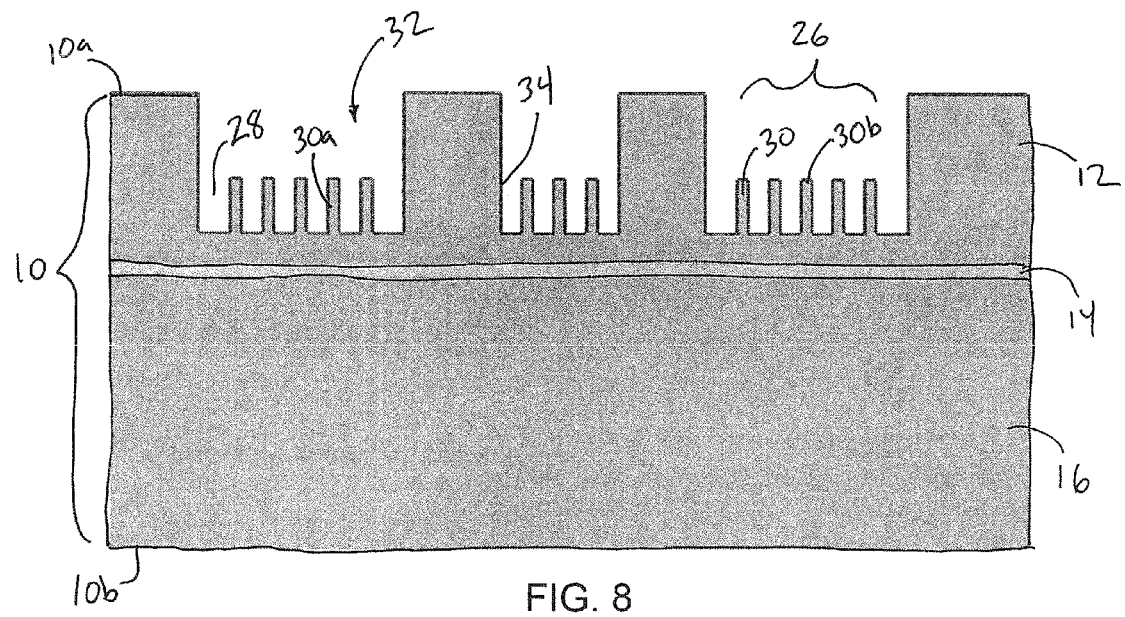
FIG. 8 is an enlarged partial cross-sectional elevational view of the substrate of FIG. 7 with the thermal oxide mask layer removed and a thin oxide layer applied thereon.

In FIG. 8, a thin oxide layer 34 is formed over the first semiconductor substrate 10. The thin oxide layer 34 covers the bottoms of the trenches 28 and the sidewalls 30a and free surfaces 30b of the plurality of mesas 30 disposed within the cavities 32. The thin oxide layer 34 may also cover the first main surface 10a of the first semiconductor substrate 10 if desired. The thin oxide layer is preferably applied using one of thermal growth, LPCVD, PECVD, APCVD, deposition, or the like. The thin oxide layer 34 preferably has a thickness in the range of about 300 nm to about 1 μm. The thin oxide layer 34 consumes the "grass" formations left by the cavity 32 etching process.

Figure 9:
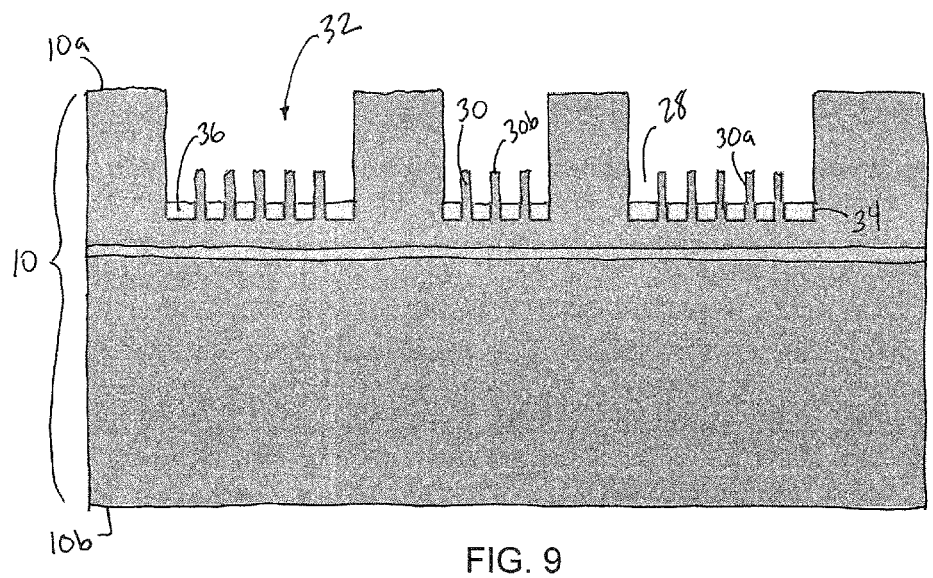
FIG. 9 is an enlarged partial cross-sectional elevational view of the substrate of FIG. 8 with a third layer of photoresist applied thereon and portions of the thin oxide layer removed.

In FIG. 9, a third layer of photoresist 36 is formed within the cavities 32. The third layer of photoresist 36 covers the bottoms of each of the plurality of trenches 28 and preferably covers a portion of the sidewalls 30b of the plurality of mesas 30. As a result, the thin oxide layer 34 is etched away from the free surfaces 30b and the portions of the sidewalls 30a of the mesas 30 not covered by the third layer of photoresist 36. This successfully removes the unwanted "grass" in the cavities 32. In preferred embodiments, the thin oxide layer 34 is removed using a buffered oxide etch (BOE) wherein the etchant has a $NH_4F/HF$ ratio of 7:1. However, other etchants or removal techniques may be used. Following the patterned removal of the thin oxide layer 34, the third layer of photoresist 36 may be removed.

Figure 10:
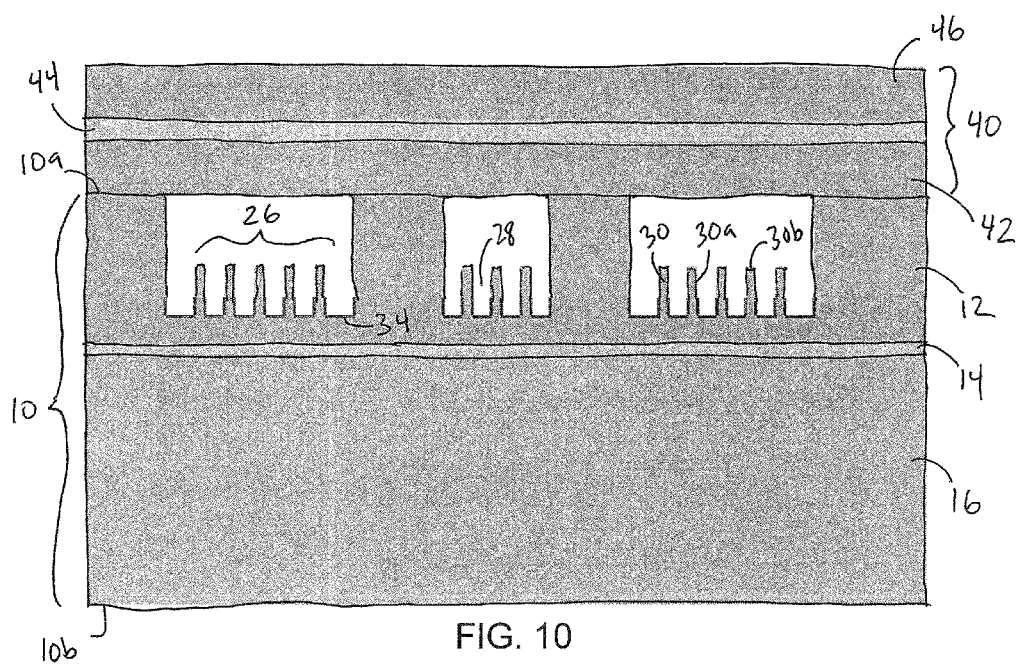
FIG. 10 is an enlarged partial cross-sectional elevational view of the substrate of FIG. 9 with the third layer of photoresist removed and a second semiconductor substrate bonded thereto.
Figure 11:
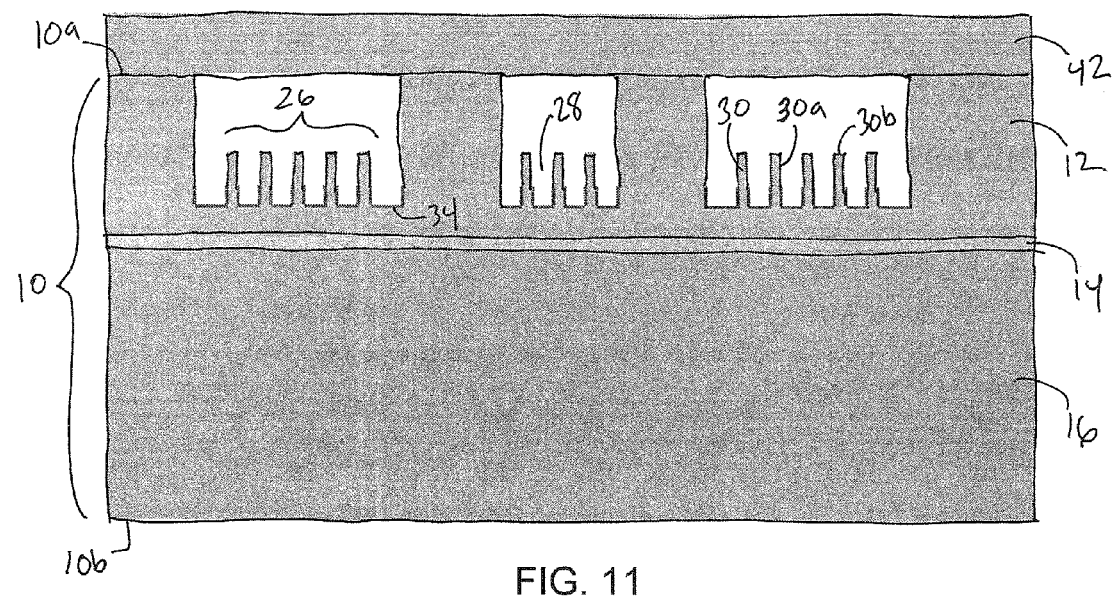
FIG. 11 is an enlarged partial cross-sectional elevational view of the substrate of FIG. 10 with portions of the second semiconductor substrate removed.

In FIG. 10, a second semiconductor substrate 40 is bonded to the first main surface 10a of the first semiconductor substrate 10. The second semiconductor substrate 40 is preferably also of SOI structure, having a device layer 42, a dielectric layer 44, and a handle layer 46. The device layer 42 is preferably about 10 μm thick, although other thicknesses may be used. The device layer 42 is bonded to the first main surface 10a of the first semiconductor substrate 10.

The bonding process may include annealing the first and second semiconductor substrates 10 and 40 in an annealing furnace at up to 1200° C. for a period of about a few minutes to six hours. Optionally, the bonding steps may include wetting the surfaces of the first and second semiconductor substrates 10 and 42 with a solution such as water ($H_2O$) and hydrogen peroxide ($H_2O_2$) and then pressing the wetted first and second semiconductor substrates 10 and 40 together and drying them prior to annealing at 800-1200° C. Plasma etches are used to remove impure oxides on the surfaces of the first and second semiconductor substrates 10 and 40 to be bonded.

Following bonding of the first and second semiconductor substrates 10, 40, the handle layer 46 and dielectric layer 44 from the second semiconductor substrate 40 are preferably removed. The handle layer 46 may be removed preferably by mechanical or chemical grinding, although other techniques, such as Chemical Mechanical Polish (CMP), etching, polishing, or the like may be used. The dielectric layer 44 is preferably removed through Tetramethylammonium hydroxide (TMAH) etching, although other techniques, such as mechanical or chemical grinding, CMP, etching, polishing, or the like may be used.

It will be appreciated by those skilled in the art that changes could be made to the embodiments described above without departing from the broad inventive concepts thereof. It is understood, therefore, that this invention is not limited to the particular embodiments disclosed, but it is intended to cover modifications within the spirit and scope of the present invention as defined by the appended claims.

I claim:

1. A method of manufacturing a semiconductor device, the method comprising:
   providing a first semiconductor substrate having a first main surface and an opposing second main surface;
   forming a pattern into the first semiconductor substrate, the pattern including a plurality of trenches defining a plurality of mesas, each of the plurality of mesas having sidewalls and a free surface formed by material of the first semiconductor substrate;
   forming a thermal oxide mask layer on the first main surface of the first semiconductor substrate;
   forming a first layer of photoresist over the thermal oxide mask layer;
   etching the thermal oxide mask layer to form an opening defining on the first main surface of the first semiconductor substrate a location of a cavity to be formed;
   forming the cavity in the first semiconductor substrate such that the pattern is recessed in the cavity;
   forming an oxide layer in the cavity and on the sidewalls and free surfaces of the plurality of mesas; and
   etching the oxide layer to remove the oxide layer from the free surfaces of the plurality of mesas and at least a portion of the sidewalls of the plurality of mesas,
   wherein the step of forming the pattern into the first semiconductor substrate comprises:
      forming a second layer of photoresist in the opening to define the pattern to be formed in the first semiconductor substrate, and
      etching the first semiconductor substrate to form the pattern.

2. The method of claim 1, wherein the step of forming the cavity includes, after formation of the pattern, etching the first semiconductor substrate to form the cavity using the thermal oxide mask layer.

3. The method of claim 2, further comprising:
   prior to formation of the oxide layer, removing the thermal oxide mask layer.

4. The method of claim 1, wherein the pattern is a honeycomb pattern.

5. The method of claim 4, wherein each of the plurality of trenches in the pattern has one of an ovular, triangular, rectangular, or hexagonal cross-section.

6. The method of claim 1, wherein the first semiconductor substrate is provided as a SOI structure.

7. The method of claim 1, wherein the oxide layer is formed to a thickness of 30 nm to 1 µm.

8. The method of claim 1, wherein the cavity is formed to a depth of between 18-22 µm.

9. A method of manufacturing a semiconductor device, the method comprising:
   providing a first semiconductor substrate having a first main surface and an opposing second main surface;
   forming a pattern into the first semiconductor substrate, the pattern including a plurality of trenches defining a plurality of mesas, each of the plurality of mesas having sidewalls and a free surface formed by material of the first semiconductor substrate;
   forming a cavity in the first semiconductor substrate such that the pattern is recessed in the cavity;
   forming an oxide layer in the cavity and on the sidewalls and free surfaces of the plurality of mesas;
   etching the oxide layer to remove the oxide layer from the free surfaces of the plurality of mesas and at least a portion of the sidewalls of the plurality of mesas; and
   bonding a second semiconductor substrate to the first main surface of the first semiconductor substrate,
   wherein the second semiconductor substrate is provided as a SOI structure with a first semiconductor layer and a second semiconductor layer disposed on opposite surfaces of an insulator layer, the second semiconductor layer being bonded to the first main surface of the first semiconductor substrate.

10. The method of claim 9, further comprising:
    following bonding of the second semiconductor substrate to the first semiconductor substrate, removing the first semiconductor layer and the insulator layer from the second semiconductor substrate.

11. The method of claim 9, wherein the pattern is a honeycomb pattern.

12. The method of claim 11, wherein each of the plurality of trenches in the pattern has one of an ovular, triangular, rectangular, or hexagonal cross-section.

13. The method of claim 9, wherein the first semiconductor substrate is provided as a SOI structure.

14. A method of manufacturing a semiconductor device, the method comprising:
    providing a first semiconductor substrate having a first main surface and an opposing second main surface;
    forming a pattern into the first semiconductor substrate, the pattern including a plurality of trenches defining a plurality of mesas, each of the plurality of mesas having sidewalls and a free surface formed by material of the first semiconductor substrate;
    forming a cavity in the first semiconductor substrate such that the pattern is recessed in the cavity;
    forming an oxide layer in the cavity and on the sidewalls and free surfaces of the plurality of mesas;
    forming a layer of photoresist in the cavity, the layer of photoresist covering bottoms of each of the plurality of trenches and a portion of the sidewalls of each of the plurality of mesas;
    etching the oxide layer to remove the oxide layer from the free surfaces of the plurality of mesas and at least a portion of the sidewalls of the plurality of mesas; and
    removing the layer of photoresist.

15. The method of claim 14, wherein the pattern is a honeycomb pattern.

16. The method of claim 15, wherein each of the plurality of trenches in the pattern has one of an ovular, triangular, rectangular, or hexagonal cross-section.

17. The method of claim 14, wherein the first semiconductor substrate is provided as a SOI structure.

\* \* \* \* \*